United States Patent [19]

Chao

[11] Patent Number: 4,968,640
[45] Date of Patent: Nov. 6, 1990

[54] ISOLATION STRUCTURES FOR INTEGRATED CIRCUITS

[75] Inventor: Fung-Ching Chao, Tainan Hsien, Taiwan

[73] Assignee: Industrial Technology Research Institute, Taiwan

[21] Appl. No.: 283,357

[22] Filed: Dec. 12, 1988

Related U.S. Application Data

[60] Division of Ser. No. 205,558, Jun. 7, 1988, Pat. No. 4,818,235, which is a continuation of Ser. No. 13,012, Feb. 10, 1987, abandoned.

[51] Int. Cl.⁵ ............................................ H01L 21/76
[52] U.S. Cl. .................................... 437/61; 437/62; 437/63; 437/162; 437/233; 437/968; 148/DIG. 117; 148/DIG. 122; 357/49; 357/50
[58] Field of Search ............ 437/61, 63, 70, 162, 437/69, 72, 73, 233, 229, 62; 156/643, 650, 651, 652, 653; 357/23.11, 49, 50; 148/DIG. 117, DIG. 122

[56] References Cited

U.S. PATENT DOCUMENTS

| | | | |
|---|---|---|---|
| 4,272,308 | 6/1981 | Varshney | 437/73 |
| 4,292,156 | 9/1981 | Matsumoto et al. | 437/73 |
| 4,441,941 | 4/1984 | Nozawa | 437/162 |
| 4,459,325 | 7/1984 | Nozawa et al. | 437/70 |
| 4,635,344 | 1/1987 | Havemann | 437/70 |
| 4,746,625 | 5/1988 | Morita et al. | 437/63 |
| 4,868,136 | 9/1989 | Ravaglia | 437/73 |

FOREIGN PATENT DOCUMENTS

| | | | |
|---|---|---|---|
| 0058381 | 11/1979 | Japan | 437/70 |
| 0143047 | 11/1980 | Japan | 437/70 |
| 0079644 | 5/1982 | Japan | 437/70 |
| 0123737 | 7/1983 | Japan | 437/70 |
| 0022342 | 2/1984 | Japan | 437/70 |
| 0081041 | 4/1987 | Japan | 437/70 |

Primary Examiner—Brian E. Hearn
Assistant Examiner—M. Wilczewski
Attorney, Agent, or Firm—Darby & Darby

[57] ABSTRACT

The invention relates to an improved isolation structure to separate active regions of integrated circuits and a method of its preparation. These isolation structures eliminate the so-called "bird's beak effect" which reduces the effective device area and thereby permit the manufacture of high packing density VLSIs. In the process, a silicon substrate is initially coated, first with a stress-release layer and then with a layer of polysilicon. After the polysilicon is removed from the active device area and patterned, a silicon nitride layer and then a thick layer of photo-resist are coated on the structure. By means of etching, the tops of the polysilicon cusps are exposed. At this stage, the vertical side walls of the polysilicon cusps remain coated with silicon nitride. The polysilicon layer is then completely oxidized to form the field oxide layer. In the final step of the process, the remaining silicon nitride and the stress-release layers are removed. The resulting field oxide is clearly defined and free of the bird's beak effect.

11 Claims, 3 Drawing Sheets

ISOLATION STRUCTURES FOR INTEGRATED CIRCUITS

This is a divisional of co-pending application Ser. No. 205,558 filed on June 7, 1988, now U.S. Pat. No. 4,818,235, which is a continuation of U.S. Pat. application Ser. No. 013,012, filed Feb. 10, 1987, now abandoned.

BACKGROUND OF THE INVENTION

Virtually all modern MOS and bipolar integrated circuits use the local oxidation of silicon (LOCOS) technique to develop regions which will laterally isolate the devices on the integrated circuit. This isolation structure is typically formed by ion-implantation doping of the field region, followed by the local growth of the thick field oxide. The active device regions are protected during these steps by masking layers of silicon nitride which are subsequently removed.

Unfortunately, the LOCOS process results in the lateral oxidation of the silicon underneath the nitride mask, forming the so-called "bird's beak effect". This effect is graphically illustrated in FIGS. 1 and 7 of U.S. Pat. No. 4,551,910. Since the "bird's beak" is insufficiently thick to form effective isolation, but sufficiently thick to prevent the formation of an active device where it is located, it reduces the effective device area and becomes one of the limiting factors in achieving high packing density for very large scale integrated circuits.

It has long been recognized in the prior art that it is desirable to reduce the bird's beak to minimize the transition regions between active areas. Other isolation technologies have been proposed as alternatives for LOCOS. For example, the side wall masked isolation (SWAMI) technique has been proposed which involves the addition of a second nitride layer on the side wall. See FIG. 2, p. 226, of K. Y. Chiu et al., "The SWAMI - A Defect Free and Near-Zero Bird's-Beak Local Oxidation Process and Its Application in VLSI Technology," *IEDM 82* (*International Electron Device Meeting*, 1982), Sec. 9.3, pp. 224–227 (1982). Thus U.S. Pat. No. 4,477,310 shows the use of nitride layers on the side wall of active regions. However, fully recessed field oxide layers are formed from an unmasked silicon substrate.

Still another method described is the so-called sealed interface local oxidation (SILO) technique which uses three layers of nitride over silicon followed by an oxide layer and a cap nitride layer. See FIG. 1, p. 223, of J. Hui et al., "Electrical Properties of MOS Devices Made With SILO Technology," *IEDM* 82, Sec. 9.2, pp. 220–223 (1982).

Also, the buried oxide (BOX) technique has been devised which uses an aluminum mask to etch a silicon groove and the subsequent removal of a plasma deposited silicon dioxide layer. See FIG. 1, p. 386, of K. Kurosawa et al., "A New Bird's-Beak Free Field Isolation Technology for VLSI Devices," *IEDM* 81, Sec. 16.4, pp. 384–387 (1981). Still another technique involves the selective polysilicon oxidation using three layers of silicon dioxide over silicon followed by a polysilicon and cap nitride.

Unfortunately, the SILO technique is not fully effective because of contamination and defects at the silicon/nitride interface which cannot be easily controlled. The SWAMI and BOX techniques are far too complicated, the BOX technique requiring several masking steps to achieve good planarity.

BRIEF DESCRIPTION OF THE INVENTION

In accordance with the present invention, a method has been developed for defining isolation structures between active regions which forms a patterned field oxide layer free of the bird's beak effect.

In the process, a buffer silicon dioxide layer (a pad oxide) is first thermally grown on a silicon wafer. A polysilicon layer is deposited thereover and a photo-resist layer coated and patterned thereon. After the isolation regions have been defined, the structure is etched to remove the polysilicon above the active regions and the residual photo-resist washed away. A silicon nitride layer is then deposited upon the wafer. An etch-back cusp levelling step is then performed. This step includes first covering the silicon nitride layer with a thick photo-resist layer and then etching the photo-resist and silicon nitride at the same rate until the tops of the polysilicon cusps are exposed. Thereafter, an ion-implantation step may be performed either before or after the residual photo-resist is removed. The polysilicon cusp, while its vertical surfaces are still coated with the silicon nitride, is completely oxidized to form the field oxide regions. The final step of the process is the removal of the residual silicon oxide and pad oxide.

The remaining field oxide layer is a clearly patterned isolation region of precisely controlled dimensions.

DESCRIPTION OF THE FIGURES

All of the figures are transverse sectional views of the silicon wafer having layers thereon deposited in accordance with the invention. The abbreviations "POLY", "SiN" and "PR" are used to designate the polysilicon, silicon nitride and photo-resist layers, respectively.

DETAILED DESCRIPTION OF THE INVENTION

In accordance with the instant invention, the improved isolation structures between active regions of an integrated circuit are formed by a novel series of steps. The isolation structure has substantially no bird's beak length and little defect density along the field oxide edge.

Figure 1:
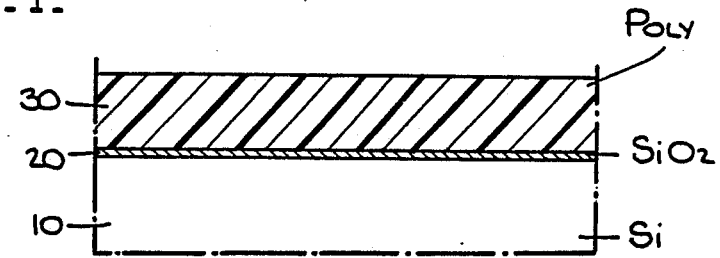
FIG. 1 shows the initial coating steps wherein the silicon wafer is first coated with a thin, thermally-coated silicon dioxide layer (the pad oxide) and a polysilicon layer.

Turning to the drawings, FIG. 1 represents the initial stages of the process. Here the silicon wafer 10 has grown thereon a thin film of silicon dioxide ($SiO_2$) 20. This layer is typically 550 angstroms and is used for stress release. Atop of the silicon dioxide layer is a layer of polysilicon 30. This layer is generally one-half the desired thickness of the field oxide and typically 3000 angstroms. It will be understood that such a layer will form a field oxide layer of about 6000 angstroms.

Figure 2:
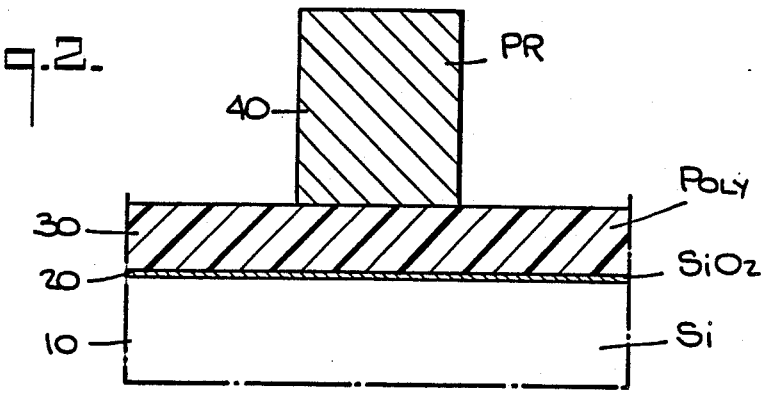
FIG. 2 shows the addition of the photo-resist atop the polysilicon layer in preparation to defining the isolation region.

FIG. 2 shows the application of a photo-resist to the polysilicon layer. The photo-resist masks the isolation region pattern on the surface of the polysilicon layer. It is designated by the numeral 40.

Figure 3:
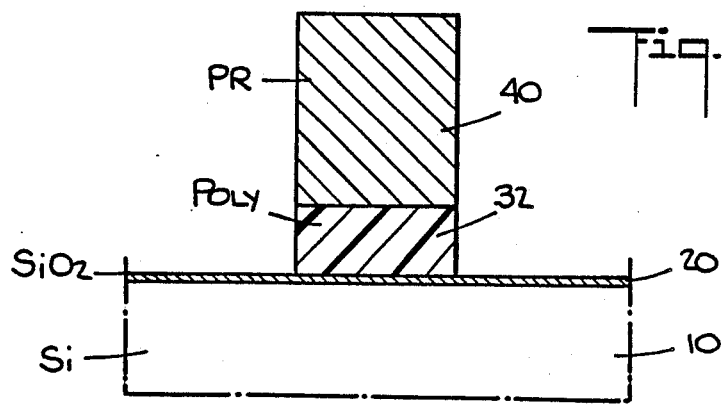
FIG. 3 shows the structure after the polysilicon layer has been stripped from the active regions and the isolation regions have been defined.

FIG. 3 shows the structure after the unmasked portion of polysilicon 30 is removed vertically until the pad oxide layer 20 is reached. Preferably, a dry etching process such as plasma etching or reactive ion etching is used to remove the unmasked polysilicon. The remainder of the polysilicon layer, frequently referred to herein as the "polysilicon island" and designated by the reference character 32, remains under the photo-resist masking pattern 40, as a result of the anisotropic character of the etching.

The plasma etching is preferably performed using $SF_6$ and Feron 115 in a Tegal-701 system (trademark of the Tegal Corporation of Novato, Calif.), while the reactive-ion etching may be performed with $NF_3$ plus Ar in an AME-8110 system (trademark of the Applied Material Co.). The former system is described in the Tegal Corporation *Operation and Maintenance Manual*, while the latter is described in *Solid State Technology*, December 1981, pp. 71–75.

Figure 4:
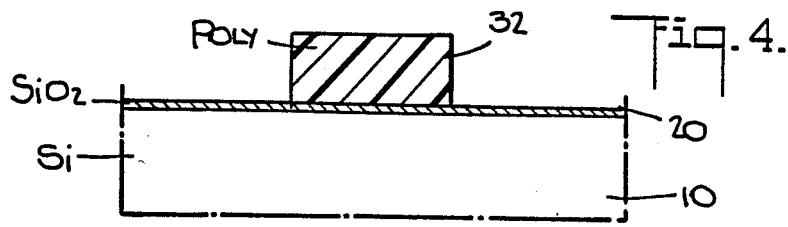
FIG. 4 shows the structure after the removal of the photo-resist, leaving the polysilicon layer over the isolation region.

The photo-resist mask is removed by a stripping solution such as sulfuric acid. The remaining structure is shown in FIG. 4. It is the polysilicon island 32 which is eventually oxidized to form the field oxide layer.

Figure 5:
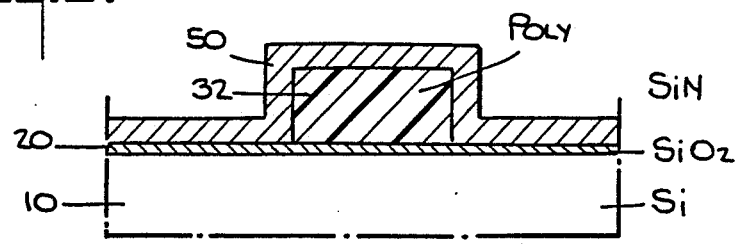
FIG. 5 shows the structure after coating with a silicon nitride layer.

The next step in the process is the coating of the silicon nitride layer 50 on the surface of the pad oxide 20 and on the sides and top of the polysilicon island 32. This coating is preferably deposited by low pressure chemical vapor deposition (LPCVD) or plasma-enhanced chemical vapor deposition (PECVD) and is used as an oxidation resist during the formation of the field oxide. The thickness of the silicon nitride layer depends on the thickness of the pad oxide layer 20 and is controlled to minimize stress effects on the silicon wafer 10 during the field oxidation step. Typically, the thickness ratio between the silicon nitride and the pad oxide is about 3. For example, where a 550 angstrom pad oxide layer is used, the silicon nitride layer may be 1500 angstroms. The structure after the silicon nitride coating step is illustrated in FIG. 5.

Atop the silicon nitride layer is coated a 1.2 nm thick photo-resist HPR 204 (trademark of Philip A. Hunt Chemical Co., West Paterson, N.J.) layer 60 which, after coating, is baked onto the structure to achieve good planarity. The baking is performed at a temperature of 165° C. for 30 minutes. The thermal energy permits the photo-resist to flow sufficiently to achieve good planarity. For the most part, the thicker the photo-resist layer, the better the planarity obtained.

Figure 6:
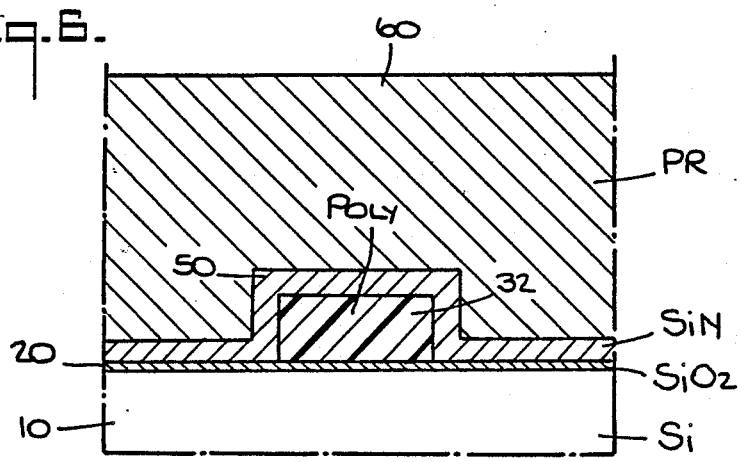
FIG. 6 shows a heavy photo-resist layer having good surface planarity coated on the silicon nitride layer.
Figure 7:
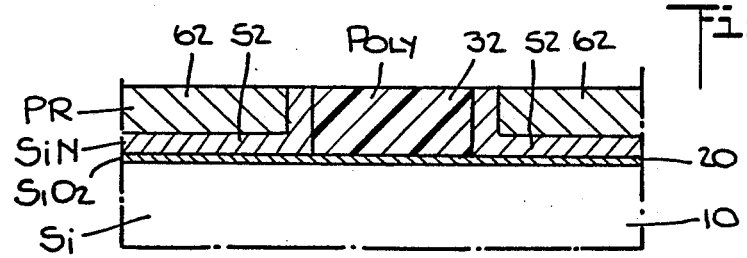
FIG. 7 shows the structure after the photo-resist and the silicon nitride has been etched back to expose the polysilicon cusps.

The structure shown in FIG. 6 is next subjected to an "etch-back step," which uniformly removes the photo-resist and the silicon nitride layer until the upper surface of the polysilicon island 32 is exposed. The etch-back step, performed in an AME-8110 system, uses 60 sccm of $CHF_3$ and 35 sccm of $O_2$, a pressure of 60 mtorr. and a power of 600 watts. The substrate temperature is between 20° and 35° C. and both the silicon nitride's and photo-resist's etch rates are about 367+20 angstroms/min. The resulting cross-section is shown in FIG. 7.

After the etching step, the side walls of the polysilicon island 32 are still coated with the silicon nitride layers 52. Also remaining are residual portions of the photo-resist layer 62.

Figure 8:
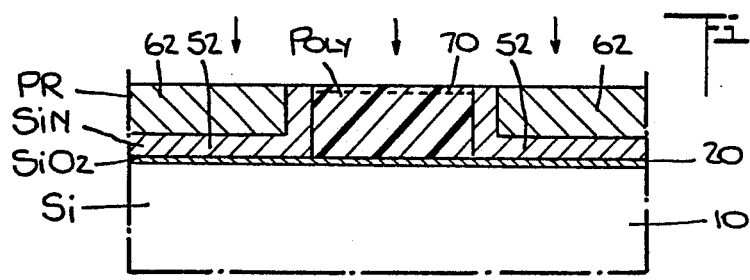
FIG. 8 shows the ion-implantation of the etched-back structure for channel stopping.

In the next step of the process, depicted in FIG. 8, the structure is implanted with channel-stopping ions which are driven into the upper region of the polysilicon layer as designated by the numeral 70. The photo-resist residue 62 and the silicon nitride residue 52 serve to mask the remainder of the structure for the implanted ions. Typically, a boron dopant is used at a concentration of $4 \times 10^{13}$ ions/$cm^2$ at a voltage of 25 Kev. This is sufficient to obtain a 12 V field threshold voltage for a p-type wafer with a resistivity of 40 to 60 ohm-cm. The thickness of the photo-resist residue 62 and the silicon nitride residue 52 is designed to insure that none of the ions will penetrate the active regions of the wafer.

Figure 9:
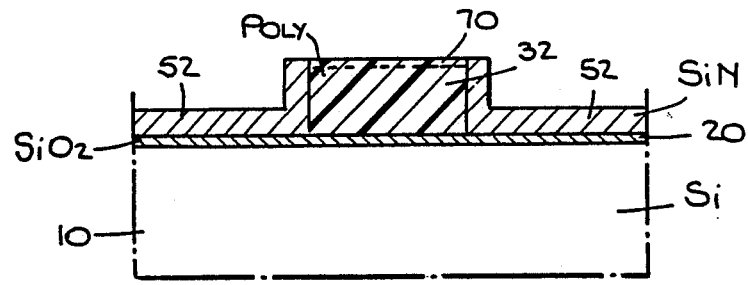
FIG. 9 shows the etched-back structure after the removal of the photo-resist.
Figure 10:
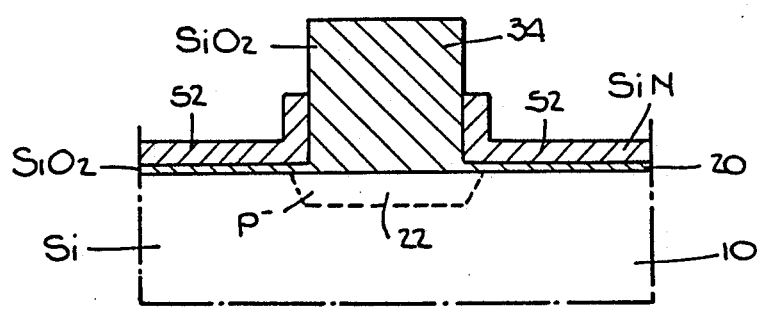
FIG. 10 shows the formation of the field oxide layer by the oxidation of the polysilicon layer.

After the ion-implantation step, the residue of the photo-resist is removed, as shown in FIG. 9, and the remaining structure, shown in FIG. 10, is subject to high temperature oxidation in a wet oxygen environment at 1000° C. for a time period sufficient to oxidize completely the polysilicon residue 32.

During this step, the polysilicon structure 32 is oxidized to form a field oxide layer 34 and the channel-stopping ions implanted in the top of the polysilicon structure diffuse into the silicon wafer 10 to form a channel-stopping region 72 directly under the field oxide region. This region serves to prevent "field inversion" as described in U.S. Pat. No. 4,570,325. The silicon dioxide thus formed, as noted above, grows to approximately twice the thickness of the original polysilicon layer.

The structure of the active regions are not affected by the oxidation step because of the high oxidation resistance of the silicon nitride residue 52. It will be noted that there is no oxide encroachment, so-called "bird's beak," under the silicon nitride residue 52 because the oxygen is consumed in the oxidation of the polysilicon island 32 or prevented from reaching the wafer because of the silicon nitride layer. Furthermore, there is no dislocation defect along the edge of the field oxide 34, in contrast to the frequent dislocation defects which occur in the semi-recessed or fully-recessed field oxide edges which are prevalent in other isolation technologies such as the LOCOS technology.

Figure 11:
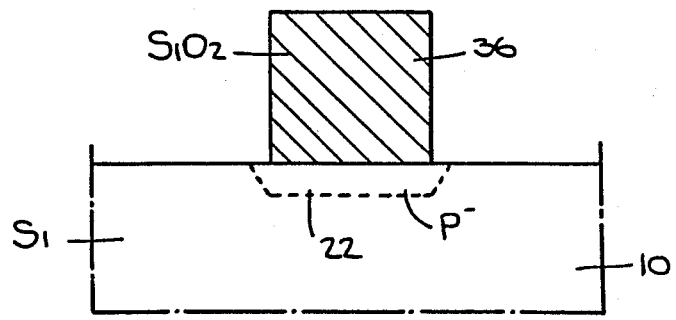
FIG. 11 shows the final isolation structure after the removal of the silicon nitride and pad oxide layers.

The final step in the process is the removal of the silicon nitride residue 52 and the pad oxide layer 20. The former is removed by using boiling phosphoric acid at a temperature of 180° C. and the latter with a hydrofluoric acid stripping solution. A layer, about the same thickness as the pad oxide, is also stripped off the field oxide layer 34 during this final stripping step. FIG. 11 shows the final isolation structure. This structure has a wide range of applications as an isolating device in integrated circuit applications.

In another embodiment of the instant invention, a semi-recesed field oxide layer is formed. In this process, the thickness of the polysilicon island is reduced without modifying the oxidation conditions. This results in the field oxide being formed from the completely oxidized polysilicon layer as well as a portion of the silicon substrate below the layer. The net effect of this procedure is to form a structure having the same overall field oxide thickness as the non-recessed structure, but having a reduced vertical sidewall or step extending above the silicon substrate. By minimizing the height of this field oxide step, the main disadvantage of the subsequent metal sputtering process, i.e., the formation of voids on the vertical surfaces, is lessened. It is well known that such voids cause open circuits which may result in the failure of the integrated circuit.

It will be understood that the series of steps used in connection with the process of the invention are individually conventional and well known in the art. It is the combination of these steps which leads to the new and improved results of this invention. Though, for example, the "etch-back" step is commonly used in interlayer planarization technique, it has not heretofore been used to remove the silicon nitride on top of the polysilicon island. Accordingly, it will be understood that many variations of the individual steps are contemplated as being within the scope of the invention, though they have not been specifically described herein.

For example, the dry etching process used to remove the unmasked polysilicon film may be performed using $NF_3$ at 20 sccm and Ar at 65 sccm, at a pressure of 40 mtorr, a DC bias of $-230$ volts, at a maximum power of 1000 watts. Stripping solutions used to remove the photo-resist mask include admixtures of sulfuric acid and hydrogen peroxide at a temperature of about 110° C. The photo-resist layer may be deposited on the silicon nitride layer and baked 30 min. at 165° C., to obtain good planarity.

In the doping step, boron is introduced by, for example, ion-implantation at an energy of from 20 to about 50 Kev to achieve a dosage level of from $1 \times 10^{13}$ to $1 \times 10^{12}$ $cm^2$. Other well-known techniques may be used for introducing the dopant into the structure.

The field oxidation layer may be formed by oxidizing the polysilicon island in the presence of oxygen and hydrogen. The time of the treatment step depends on the thickness of the polysilicon island. For example, if the polysilicon layer is 4500 angstroms thick, the oxidation may be performed for about 190 minutes at 980° C. to form an oxide layer 9000 angstroms thick. It will be understood that both field oxide thickness and $p^-$ field implantation doses affect the threshold voltage drastically. A proper combination of the thickness of the field oxide and $p^-$ field implantation doses is used to achieve the desired field threshold voltage. Accordingly, the thickness of the final field oxide and of the in-process polysilicon (the latter being about a half of the field oxide thickness) may be varied.

What is claimed is:

1. An isolation region for an integrated circuit prepared by:
   (a) forming a polysilicon layer over the isolation region atop a silicon substrate coated with a stress-release layer;
   (b) masking the isolation region of the polysilicon layer;
   (c) removing the unmasked portion of the polysilicon layer by dry etching so as to leave an upwardly projecting polysilicon layer over the isolation region;
   (d) removing the mask from the top of said polysilicon layer;
   (e) sequentially depositing on the structure from step (d), including on the top and the vertical surfaces of said upwardly projecting polysilicon layer, a silicon nitride layer;
   (f) depositing a photo-resist layer on said silicon nitride layer of a thickness sufficient to form a planar surface above the top of said polysilicon layer;
   (g) etching back the photo-resist layer and the silicon nitride layer anisotropically so as to expose the top surface of the polysilicon layer;
   (h) removing the residual photo-resist; and
   (i) oxidizing the polysilicon layer to form a non-recessed field oxide layer, while the vertical surfaces of the layer remain masked with said silicon nitride layer.

2. An integrated circuit having an isolation region prepared by:
   (a) forming a polysilicon layer over the isolation region atop a silicon substrate coated with a stress-release layer;
   (b) masking the isolation region of the polysilicon layer;
   (c) removing the unmasked portion of the polysilicon layer by dry etching so as to leave an upwardly projecting polysilicon layer over the isolation region;
   (d) removing the mask from the top of said polysilicon layer;
   (e) sequentially depositing on the structure from step (d), including on the top and the vertical surfaces of said upwardly projecting polysilicon layer, a silicon nitride layer;
   (f) depositing a photo-resist layer on said silicon nitride layer of a thickness sufficient to form a planar surface above the top of said polysilicon layer;
   (g) etching back the photo-resist layer and the silicon nitride layer anisotropically so as to expose the top surface of the polysilicon layer;
   (h) removing the residual photo-resist; and
   (i) oxidizing the polysilicon layer to form a non-recessed field oxide layer, while the vertical surfaces of the layer remain masked with said silicon nitride layer.

3. The integrated circuit of claim 2 wherein the stress-release layer is a pad oxide layer.

4. The integrated circuit of claim 2 wherein the silicon substrate is a p-type or an n-type silicon wafer.

5. The integrated circuit of claim 2 wherein, during said oxidation step, a non-recessed field oxide is formed from the completely oxidized polysilicon layer.

6. The integrated circuit of claim 2 wherein the dry etching is a plasma etching or a reactive ion etching.

7. The integrated circuit of claim 2 wherein the silicon nitride is deposited by LPCVD or PECVD.

8. The integrated circuit of claim 2 wherein the structure is subject to ion-implantation after the etch-back step, either before or after the photo-resist residue is stripped.

9. The integrated circuit of claim 2 wherein the isolation region forms part of a PMOS, NMOS or CMOS.

10. The integrated circuit of claim 2 wherein after the etch-back step and the stripping of the photo-resist residue, a $p^-$ field mask is defined, the structure is subjected to ion-implantation, and the $p^-$ field mask is stripped.

11. The integrated circuit of claim 2 wherein, after the oxidation step (i), the remaining silicon nitride and stress-release layers are removed.

* * * * *